(12) United States Patent
Bartok

(10) Patent No.: US 6,426,486 B1
(45) Date of Patent: Jul. 30, 2002

(54) OPTICAL APPARATUS AND METHOD FOR SHRINKING HEAT SHRINK TUBING, FUSING WIRES AND SOLDER AND UNSOLDER PACKAGED ELECTRONIC COMPONENTS

(75) Inventor: Stephen Bartok, Rancho Palos, CA (US)

(73) Assignee: Judco Manufacturing, Incorporated ( * ) Notice: Subject to any disclaimer, the term of this patent is extended or adjusted under 35 U.S.C. 154(b) by 0 days.

(21) Appl. No.: 09/596,254

(22) Filed: Jun. 16, 2000

(51) Int. Cl.[7] .......................... F27D 11/02; F27B 17/00
(52) U.S. Cl. .................. 219/405; 219/85.12; 392/423; 392/424
(58) Field of Search ................. 219/405, 395, 219/85.12, 85.13; 392/421, 423–425; 362/296–298, 302, 304, 310; 250/492.1, 492.22; 264/492

(56) References Cited

U.S. PATENT DOCUMENTS

| | | | | |
|---|---|---|---|---|
| 2,355,459 A | * | 8/1944 | Miskella | 392/421 |
| 3,472,721 A | * | 10/1969 | Abramson et al. | 392/423 |
| 3,509,317 A | * | 4/1970 | Valsamakis et al. | 219/85.12 |
| 3,588,425 A | * | 6/1971 | Erickson | 219/85.12 |
| 3,592,992 A | * | 7/1971 | Costello | 219/85.13 |
| 3,600,553 A | * | 8/1971 | Costello | 392/421 |
| 3,649,811 A | * | 3/1972 | Schoenthaler | 392/421 |
| 3,657,508 A | * | 4/1972 | Studnick | 219/85.13 |
| 3,674,974 A | * | 7/1972 | Costello | 219/85.12 |
| 3,674,975 A | * | 7/1972 | Nugent et al. | 219/85.12 |
| 3,744,557 A | * | 7/1973 | Costello | 392/421 |
| 3,763,348 A | * | 10/1973 | Costello | 392/423 |
| 3,788,560 A | * | 1/1974 | Hough et al. | 392/421 |
| 4,089,047 A | * | 5/1978 | Luderitz | 362/297 |
| 4,419,169 A | * | 12/1983 | Becker et al. | 392/422 |
| 4,419,304 A | * | 12/1983 | Ficke et al. | 264/493 |
| 4,460,820 A | | 7/1984 | Matsumoto et al. | 219/385 |
| 4,605,839 A | * | 8/1986 | Rasmussen et al. | 392/421 |
| 4,788,403 A | * | 11/1988 | Hayakawa et al. | 219/85.12 |
| 4,812,620 A | * | 3/1989 | Hayakawa et al. | 392/421 |
| 4,858,090 A | * | 8/1989 | Downs | 362/297 |
| 5,060,289 A | | 10/1991 | Abramson | 392/423 |
| 5,762,707 A | * | 6/1998 | Shindo | 117/200 |
| 6,106,761 A | * | 8/2000 | Sjoberg et al. | 264/492 |

FOREIGN PATENT DOCUMENTS

| | | | |
|---|---|---|---|
| JP | 9-257374 | * | 10/1977 |
| WO | 9710936 | * | 3/1977 |

OTHER PUBLICATIONS

Eraser Company Inc., Syracuse New York, Glo–ring Infra-red Heat tools.

"Tube Shrinking Systems" relating to a Model 4825 easy-Shrink™ Workstation.

* cited by examiner

*Primary Examiner*—Joseph Pelham
(74) *Attorney, Agent, or Firm*—Kenneth W. Float

(57) ABSTRACT

Optical heat-generating apparatus and methods that rapidly, controllably deliver energy (heat) to heat shrink tubing disposed over wires or other components and that may be used to fuse insulated wires together, and solder and unsolder packaged IC chips. In general, the apparatus comprises a housing having one or more reflective cavities that each comprise a linear elliptical reflective surface having first and second focal lines, and into which the heatable component is inserted and disposed along the first focal line. One or more optical heat-generating elements are disposed along the second focal line of each respective linear elliptical reflective surface that emit energy that is focused by the one or more linear elliptical reflective surfaces onto the heatable component disposed along the first focal line. A number of different embodiments of the apparatus have been developed. Lengths of heat shrink tubing may be readily shrunk using various embodiments of the present invention in less than one second.

26 Claims, 13 Drawing Sheets

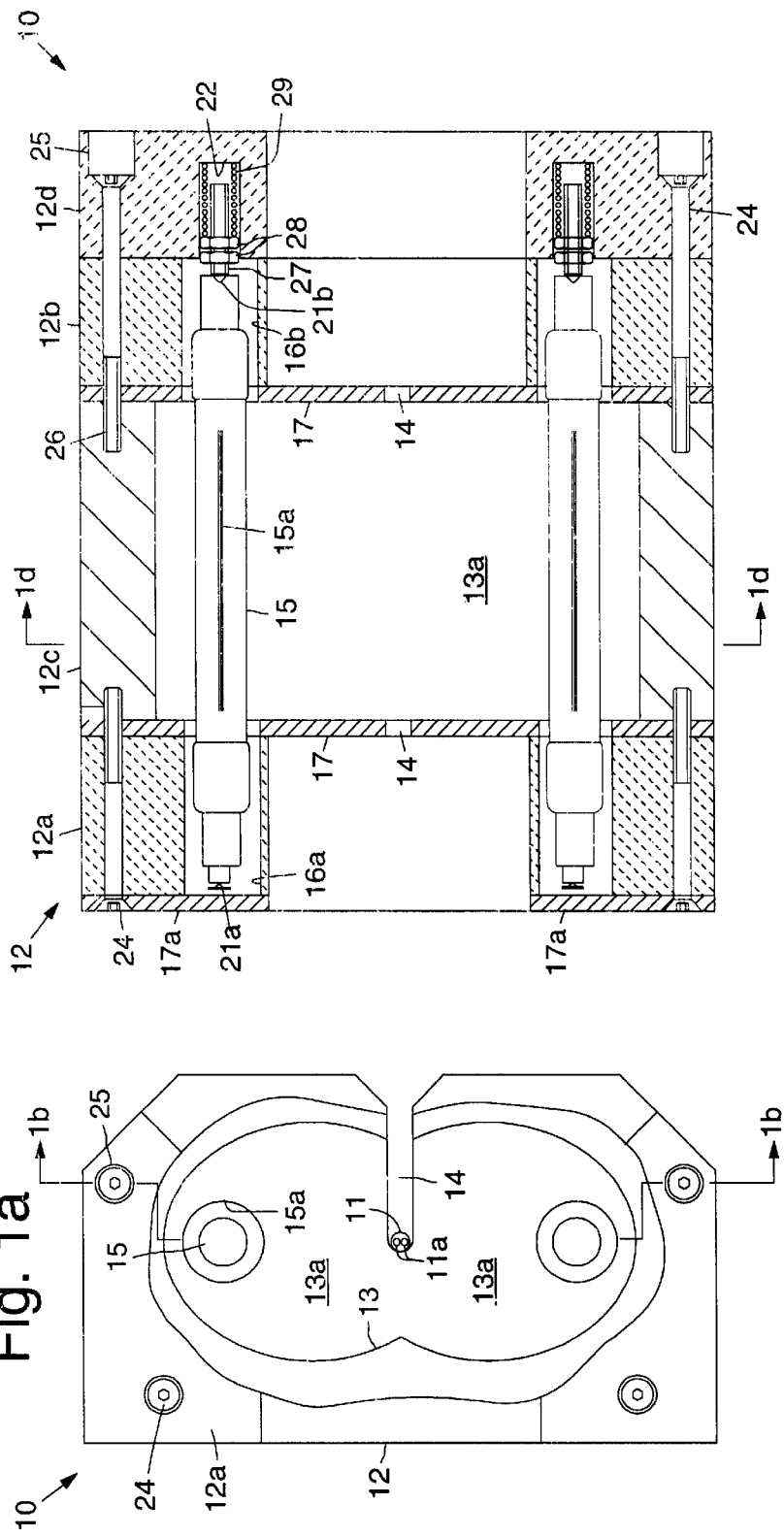

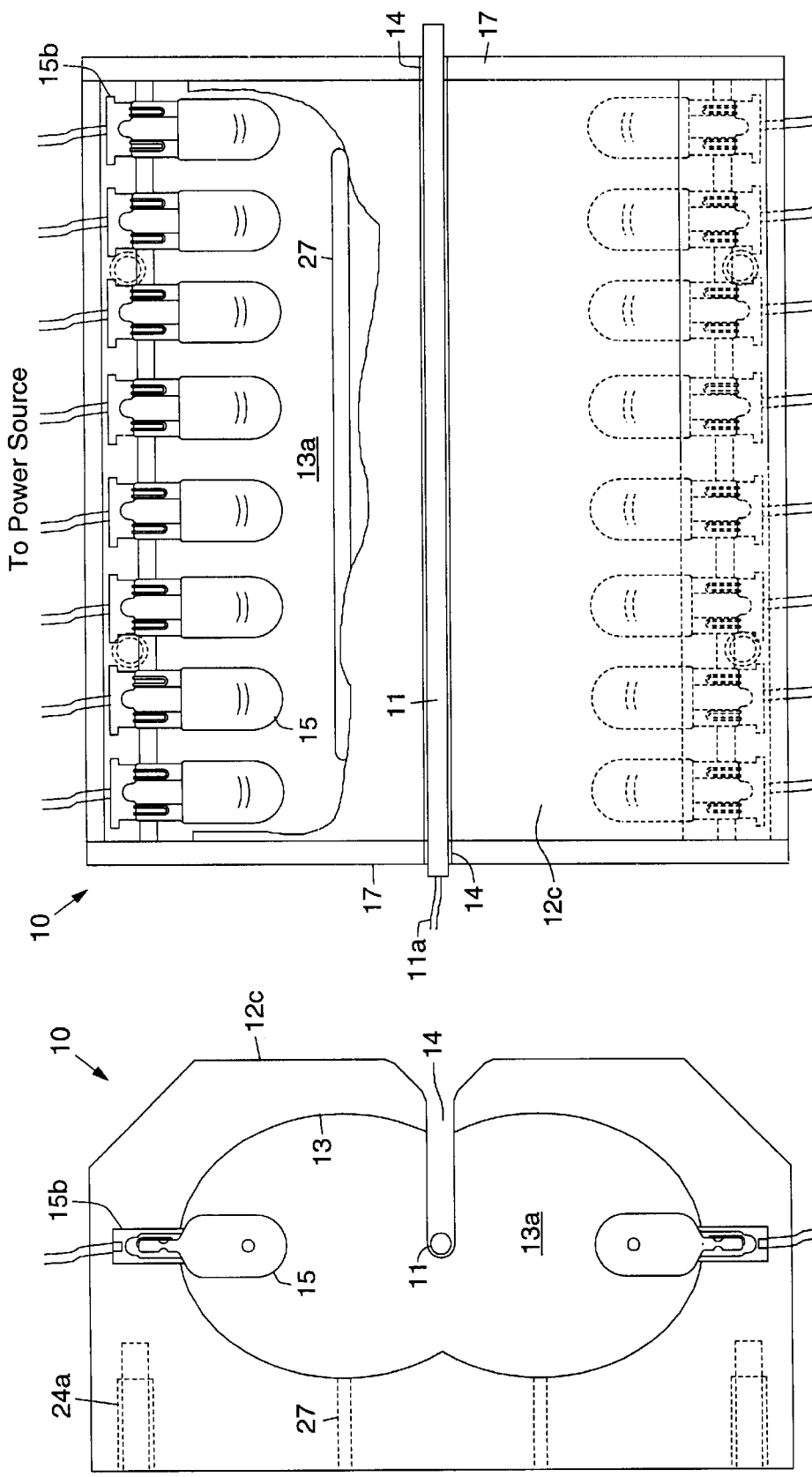

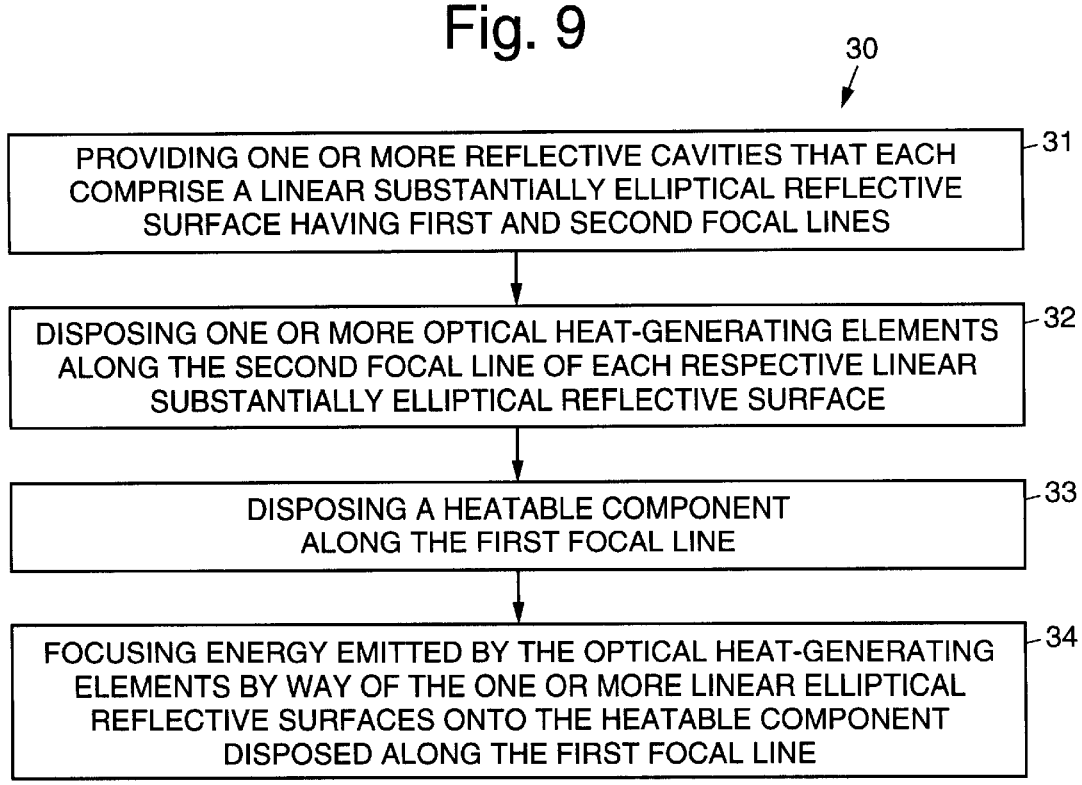
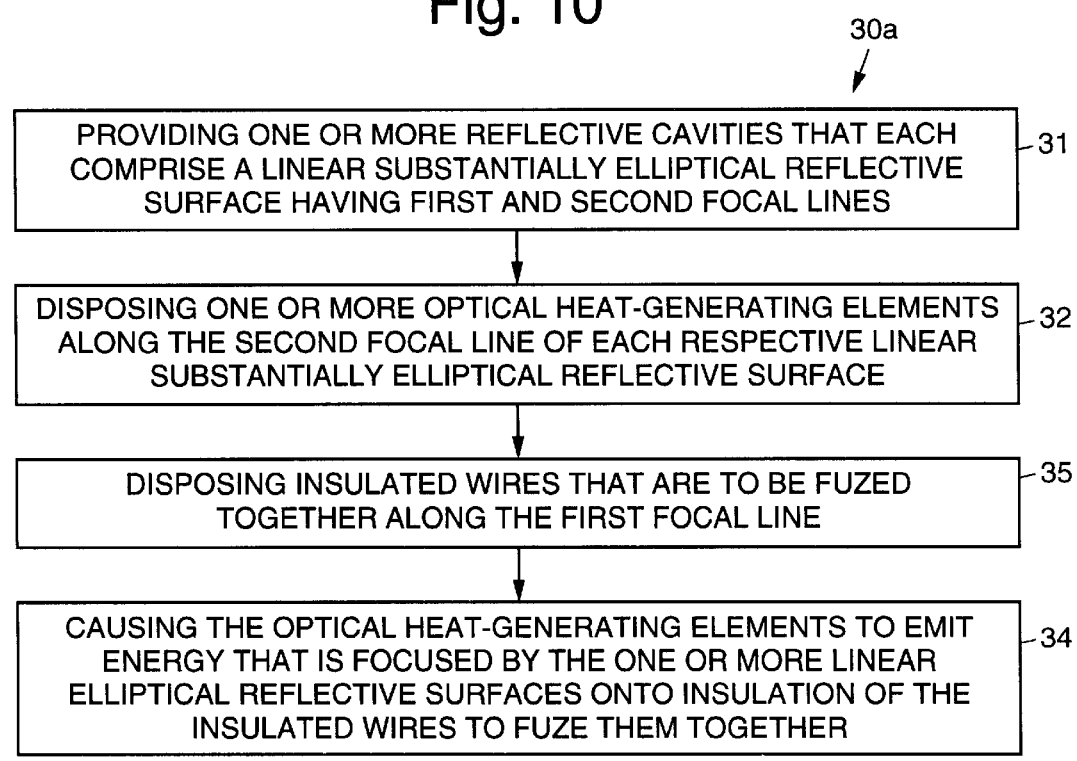

OPTICAL APPARATUS AND METHOD FOR SHRINKING HEAT SHRINK TUBING, FUSING WIRES AND SOLDER AND UNSOLDER PACKAGED ELECTRONIC COMPONENTS

BACKGROUND

The present invention relates generally to apparatus for heating components, and more particularly, to optical heat-generating apparatus and methods for use in shrinking heat shrinkable tubing, fusing insulated wires together, and solder and unsolder packaged IC chips.

The assignee of the present invention manufactures switching devices having wires or harnesses extending therefrom that require insulation. Typically, heat shrink tubing is placed over exposed wires and is heated so that it shrinks to closely fit around the wires.

Prior art apparatus for heating heat-shrinkable tubes is disclosed in U.S. Pat. No. 4,460,820 issued to Matsumoto, et al. The apparatus comprises a supporting unit for a heat-shrinkable tube and a plurality of heating units that are disposed in the longitudinal direction of the heat-shrinkable tube. The heating units comprise electric heaters that can be operated independently.

U.S. Pat. No. 5,060,289 issued to Abramson discloses a portable tube shrinking tool. The tool comprises a heating device that includes a pair of facing concave surfaces for directing radiant energy toward an object to be heated positioned in a receiving space between the concave surfaces. The radiant energy is produced by two pluralities of radiant heating lamps, each of which is located between the receiving space and a corresponding concave surface. The lamps and concave surfaces are contained within an enclosure that has an access opening to the receiving space, and with each concave surface substantially extending to that opening.

Furthermore Eraser Company Inc. of Syracuse N.Y., manufactures a variety of glow-ring type heating devices for use in shrinking heat shrinkable tubing. Quartz encapsulated heating elements are used that open and close in the manner of a thumb and forefinger to encircle workpieces that are heated by the heating elements.

Conventional approaches for shrinking the heat shrinkable tubing around the wires were tried but found inefficient or impractical for a high volume manufacturing environment. For example, hot air and infrared heat conveyor ovens were evaluated for use, but were found unsuitable. It was determined that all components attached to the wiring harness would have been exposed to heat, which is not desirable.

Hot air guns were initially used on stands attached to work benches on production lines to shrink the heat shrinkable tubing. The heat gun approach resulted in slow operation. It was also found that the tubing was not straight after shrinking. Additionally, the harness often times got tangled. From a production perspective, there was too much human handling of the wiring harness. The heat guns also had other disadvantages including power usage, heat, noise, and maintenance problems.

Heat delivery is highly dependent on distance from and alignment with the nozzle of the heat gun, and rotating the tubing is desirable for even shrinking. Shrinking more than a nozzle width of tubing (typically about 2 inches) is particularly slow and demanding. While hot air guns are well suited for occasional use, in a production environment they require too much mental concentration, and quality control problems can result.

Ellipsoid (surface of rotation, not extrusion) reflectors, that focus light located in one focal point at the other focal point, are old art. While only half of the ellipsoid surface is typically used, it captures about 80% of the energy and delivers it to about ⅛ of the target surface. A full ellipsoidal surface entirely enclosing both the source and the target, delivers the light to the target in a cardoid pattern. Most of the light strikes the target from the direction of the source and nothing comes from the opposite direction where the target casts a shadow on the reflector.

The directionality of the cardoid pattern produced by such a full ellipsoidal reflector is such that typically about ⅚ of the radiant energy is delivered to the target half facing the source and ⅙ to the back half. Such uneven energy delivery scorches the tubing on one side while leaving the other side cold.

In view of the above, it is an objective of the present invention to provide for improved optical heat-generating apparatus and methods for use in shrinking heat shrinkable tubing and fuse insulated wires together.

SUMMARY OF THE INVENTION

To accomplish the above and other objectives, the present invention provides for optical heat-generating apparatus and methods that rapidly, controllably deliver energy (heat) to heat shrink tubing disposed over wires or other components and that may be used to fuse insulated wires together. A number of different embodiments of the apparatus have been developed. In times of from less than 1 second up to 3 seconds, lengths of heat shrink tubing have been shrunk ranging between 3 to 20 inches, although there are no specific length limitations on the apparatus.

In general, the optical heat-generating apparatus comprises a housing having one or more reflective cavities that each comprise a linear elliptical reflective surface having first and second focal lines, and into which the heatable component is inserted and disposed along the first focal line. One or more optical heat-generating elements are disposed along the second focal line of each respective linear elliptical reflective surface that emit energy that is focused by the one or more linear elliptical reflective surfaces onto the heatable component disposed along the first focal line.

An exemplary optical heat-generating apparatus comprises a modular heater having two quartz-halogen lamps with straight coil filaments. To deliver heat evenly to the tubing from all directions (360 degrees around the longitudinal axis of the tubing) a double linear elliptical reflector module, about as long as the lighted filament, is disposed around the lamps. At each end of the reflector, a thin plate with polished reflective surfaces helps position the tubing at a common focal point of both ellipses, while the filaments are held at the outer focal point of each reflector.

The optical heat-generating apparatus is preferably maintained at a partial heat level between power applications, to reduce reaction time. This also reduces thermal shock to the filaments, extending bulb life. A foot-switch or button actuated timer may also be used to control power on-time for consistent quality.

Double lobed linear elliptical, and triple lobed linear elliptical reflectors were evaluated for use in the present invention. It was determined that the double lobe design was preferred, but three or more lobes might be desirable in specific applications. For most applications, the double lobe design offers well-balanced circumferential heat delivery, simplicity of construction use, cooling (a factor in continuous assembly line use) and service.

Some embodiments of the apparatus have a modular construction, where shrink length is not limited by filament length. One embodiment uses one lamp per shrunk length, where the lamp ends and terminations alternate on each side of the of the tube.

Another embodiment provides circumferential heat delivery by employing two different elliptical reflectors sharing the source focal line. One reflector, however, redirects about half of the light to a phantom focal point, thus missing the target. A flat reflector reflects this light into the target from behind, evening out power delivery.

Another embodiment uses staggered dual reflectors that are angularly rotated around an axis relative to the target, and uses relatively small (2¾ inch long) lamp segments. Yet another embodiment uses a string of small lamps in dual elliptical reflectors, each in a socket, offering essentially any heat zone length, from a few thousands of an inch to many feet.

Means for limiting heat delivery to specific areas by masking, preferably with reflective surfaces, may be built into the apparatus, or pre-applied to the part before insertion into the apparatus. Heat absorption is color dependent, and in many applications, color (either a colored material or an applied paint) may be used to help or hinder heating of specific parts.

Heat shrink tubing is widely used in many different applications. In terms of location and accessibility at the shrink operation, most fall into one of two categories: "jacket" and "termination". The apparatus that have been reduced to practice, satisfies the "jacket" need, where the shrinkable tubing is disposed over a length of wire or similar long, slender object, and one or both ends emerge from the tube and are available to position the tube for the shrinking operation.

The "termination" application has limited accessibility, and typically one or more wires or the like are next to a bulky object such as a connector or bulkhead. One embodiment of the present invention allows all the bulky components (lamp and main reflectors) to be off to one side, with only the rear mirror behind the shrinkable tubing. This permits fairly even delivery of energy to the heat shrink tubing.

An exemplary method of shrinking heat shrinkable tubing is as follows. One or more reflective cavities are provided that each comprise a linear elliptical reflective surface having first and second focal lines. One or more optical heat-generating elements are disposed along the second focal line of each respective linear elliptical reflective surface. A heatable component is disposed along the first focal line. Energy emitted by the optical heat-generating elements is focused by the one or more linear elliptical reflective surfaces onto the heatable component disposed along the first focal line.

An exemplary method of fusing insulated wires together is as follows. One or more reflective cavities are provided that each comprise a linear elliptical reflective surface having first and second focal lines. One or more optical heat-generating elements are disposed along the second focal line of each respective linear elliptical reflective surface. Insulated wires that are to be fused together are disposed along the first focal line. The energy emitted by the optical heat-generating elements is focused by the one or more linear elliptical reflective surfaces onto insulation of the insulated wires to fuse them together.

Another aspect of the present invention provides for two adjacent linear elliptical reflective surfaces, each having first and second focal lines, where the second focal lines are coincident. Heatable components are disposed along the two first focal lines. This embodiment may be used to solder or unsolder electronic components having multiple leads arranged in two parallel lines, such as dual inline packaged semiconductor chips.

BRIEF DESCRIPTION OF THE DRAWINGS

The various features and advantages of the present invention may be more readily understood with reference to the following detailed description taken in conjunction with the accompanying drawing, wherein like reference numerals designate like structural elements, and in which:

FIGS. 1a and 1b illustrate partially exposed side and cross-sectional top views of an exemplary embodiment of optical apparatus in accordance with the principles of the present invention for shrinking heat shrinkable tubing;

FIG. 1c illustrates a side view of an exemplary optical heat-generating element used in the apparatus shown in FIGS. 1a and 1b;

FIGS. 5a and 5b illustrate side and top cross-sectional views of another exemplary embodiment of optical heat-generating apparatus in accordance with the principles of the present invention;

FIGS. 9 and 10 are flow charts that illustrate exemplary methods in accordance with the principles of the present invention for shrinking heat shrinkable tubing and fusing insulated wires together;

DETAILED DESCRIPTION

Figure 1D:
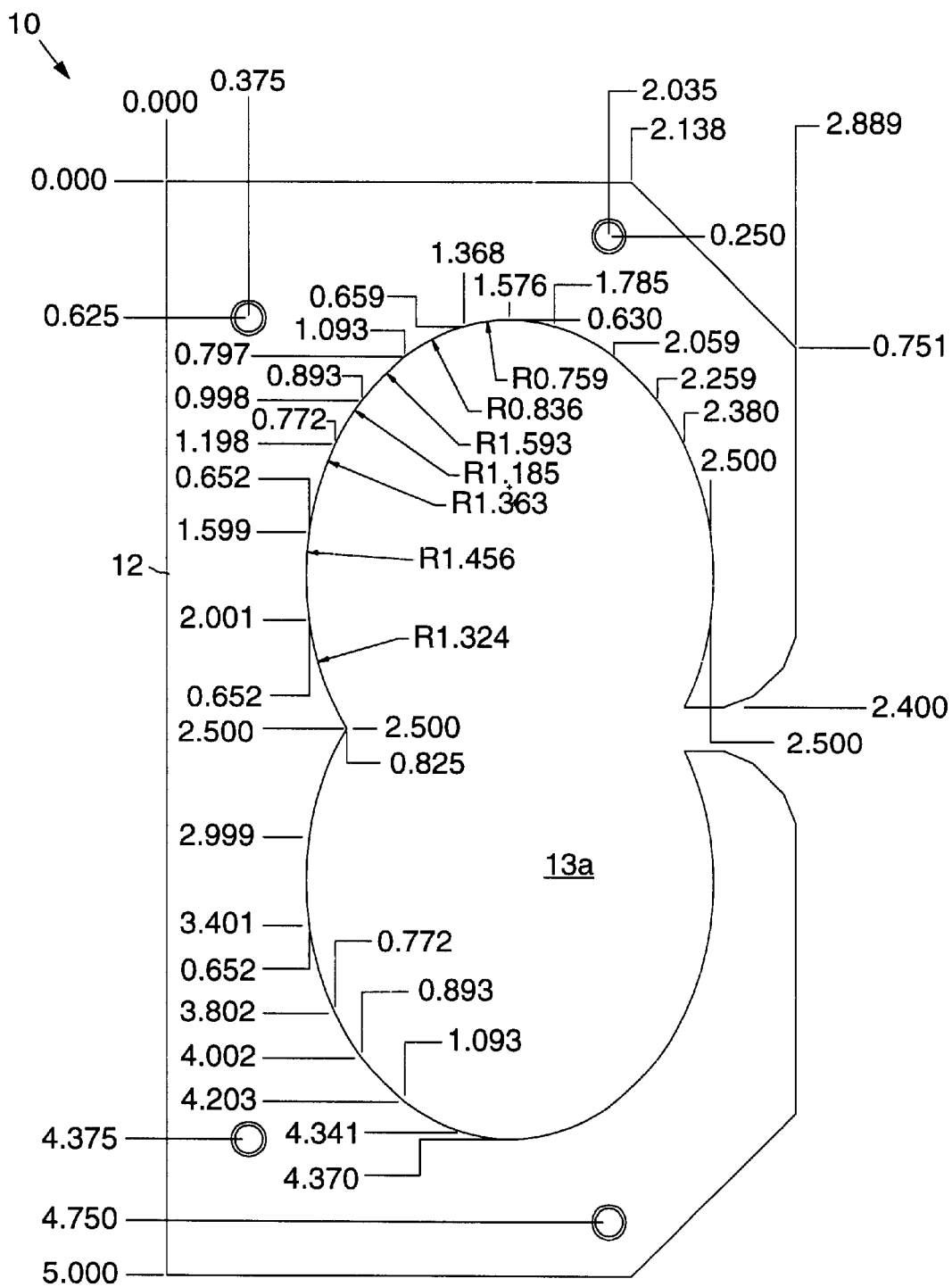
FIG. 1d illustrates dimensions of a cross sectional view of an exemplary reduced-to-practice optical apparatus.

Referring to the drawing figures, FIGS. 1a and 1b illustrate partially exposed side and cross-sectional top views of an exemplary embodiment of optical heat-generating apparatus 10 in accordance with the principles of the present invention for heating a heatable component 11. The optical heat-generating apparatus 10 may be used to shrink heat shrink tubing 11 around one or more wires, tubes or other slender objects. The optical heat-generating apparatus 10 provides for rapid, controlled delivery of energy (heat) to the heat shrink tubing 11. The first embodiment of the optical heat-generating apparatus 10 is a relatively short device that is used to shrink relatively short lengths of the tubing 11.

The optical heat-generating apparatus 10 comprises a reflective central section 12c which may be made of aluminum, for example. The reflective central section 12c comprises a plurality of reflectors 13 or reflective surfaces 13 that have reflective cavities 13a formed therein whose contours will be described in more detail below. The cavities 13a may be made reflective by polishing the internal aluminum surface of the reflective central section 12c.

A reflective end plate 17 is disposed at each end of the reflective central section 12c. The reflective end plates 17 have polished internal reflective surfaces. A slot 14 is formed in each reflective end plate 17 into which wires 11a (components) surrounded by shrink tubing 11 are inserted, and which is used to align the wires 11a and shrink tubing 11 during shrinking of the tubing 11. The reflective end plates 17 have openings therein through which optical heat-generating elements 15 extend.

First and second end sections 12a, 12b are disposed at respective ends of the reflective central section 12c outside of the respective end plates 17. The first and second end sections 12a, 12b are made of a high temperature insulating material, such as phenolic, for example. The first end section 12a comprises two openings 16a that are designed to receive first ends of two optical heat-generating elements 15. First ends of two optical heat-generating elements 15 respectively contact spring-loaded electrical contacts 21a. The optical heat-generating elements 15 are preferably quartz-halogen lamps with straight coil filaments 15a.

The second end section 12b also comprises two openings 16b that are designed to receive second ends of the two optical heat-generating elements 15. The second end section 12b abuts a third end section 12d which comprises two cavities 22 that house spring-loaded electrical contacts 21b. The third end section 12d is made of a high temperature insulating material, such as phenolic, for example. The spring-loaded electrical contacts 21b disposed in the third end section 12d comprise a conductive member 27, such as a pointed brass screw, having two jamb nuts 28 disposed thereon, that retain a spring 29 in the cavity 22. The spring-loaded electrical contacts 21 disposed in the third end section 12d contact the second ends of the two optical heat-generating elements 15.

FIG. 1c illustrates a side view of an exemplary optical heat-generating element comprising a preferred quartz-halogen lamp along with the respective contacts 21a, 21b. Each of the spring-loaded electrical contacts 21a, 21b is connected to a power source (as illustrated in FIG. 1c).

The first, second and third end sections 12a, 12b, 12d are secured to the reflective central section 12c are secured together using machine screws 24, for example. Outer end plates 17a are used to secure the first end section 12a to the central section 12c. The machine screws 24 are inserted into holes 25 formed through the first, second and third end sections 12a, 12b, 12d that mate with threaded holes 26 in the reflective central section 12c.

FIG. 1d illustrates dimensions of an exemplary reduced to practice embodiment of the optical apparatus 10 shown in FIGS. 1a and 1b. In accordance with the principles of the present invention, the cavities 13a are formed by a double lobed linear substantially elliptical reflective surface. The substantially elliptical surface of the cavities 13a may, for example, be created by a series of arcuate surfaces as illustrated in FIG., 1d. Dimensions are referenced from the upper left corner at the location identified as 0.0000–0.000. The various radii defining the surface are shown (prefaced by an "R"). Dimensions are in inches. The beginning and ending points of each of the arcs are defined by the intersection of the dimension lines of the respective x-axis and y-axis coordinates of the point.

Referring again to FIG. 1a, the optical heat-generating elements 15 are disposed along (are collinear with) a focal line each respective cavity 13a. The respective inner reflective surfaces 13 of the cavities 13a are configured or contoured so that about 70% of the energy output by the optical heat-generating elements 15 is reflected onto the surface of the heat shrink tubing 11 facing the optical heat-generating elements 15.

The optical heat-generating apparatus 10 thus comprises a modular heater using readily available quartz-halogen lamps 15 with straight coil filaments 15a, for example. To deliver heat evenly to the tubing 11 from all directions (360 degrees around the longitudinal axis of the tubing 11) a double linear elliptical reflector 13, about as long as the lighted filament 15a is provided by the reflective central section 12c. End plates 17 with polished reflective surfaces and slots 14 are disposed at each end of the reflector 13. The slots 14 terminate at a location, which helps to position the tubing 11 at a common first focal line of both elliptical surfaces, while the filaments 15a are held at an outer second focal line of each reflector 13. For the type and thickness of heat shrink tubing 11 that is typically used, actual power on shrink times vary between 0.5 and 1 second.

The optical heat-generating apparatus 10 is preferably maintained at a partial heat level between power applications, to reduce reaction time. This also reduces thermal shock to the filaments, extending the life of the heat generating elements 15. A foot-switch or button actuated timer (not shown) may be used to control full power on time for consistent quality.

Double lobed linear elliptical and triple lobed linear elliptical reflectors 13 were evaluated for use in the apparatus 10. It was determined that a double lobe design was preferred, although three or more lobes may be desirable in other specific applications. For most applications, the double lobe design offers well balanced circumferential heat delivery, simplicity of construction use, cooling (a factor in continuous assembly line use) and service.

The lengths of the tubing to be shrunk may vary considerably. Very even shrinking is obtained when the length of the reflector 13 is about the same as the length of the lighted filament 15a. One type of heat generating element 15 is a lamp rated at 500 Watts, 120 V, and has about 2¾ inch working length. While there are lamps 15 with filaments 15a up to 24 inches long, rated 1500 to 2500 Watts and 240 V, their price and availability are a problem (over $100 each)

and they are relatively expensive and extremely fragile. Therefore, for longer lengths, an extendable, modular construction is preferred utilizing 2¾ inch lamps, as described below.

Figure 2:
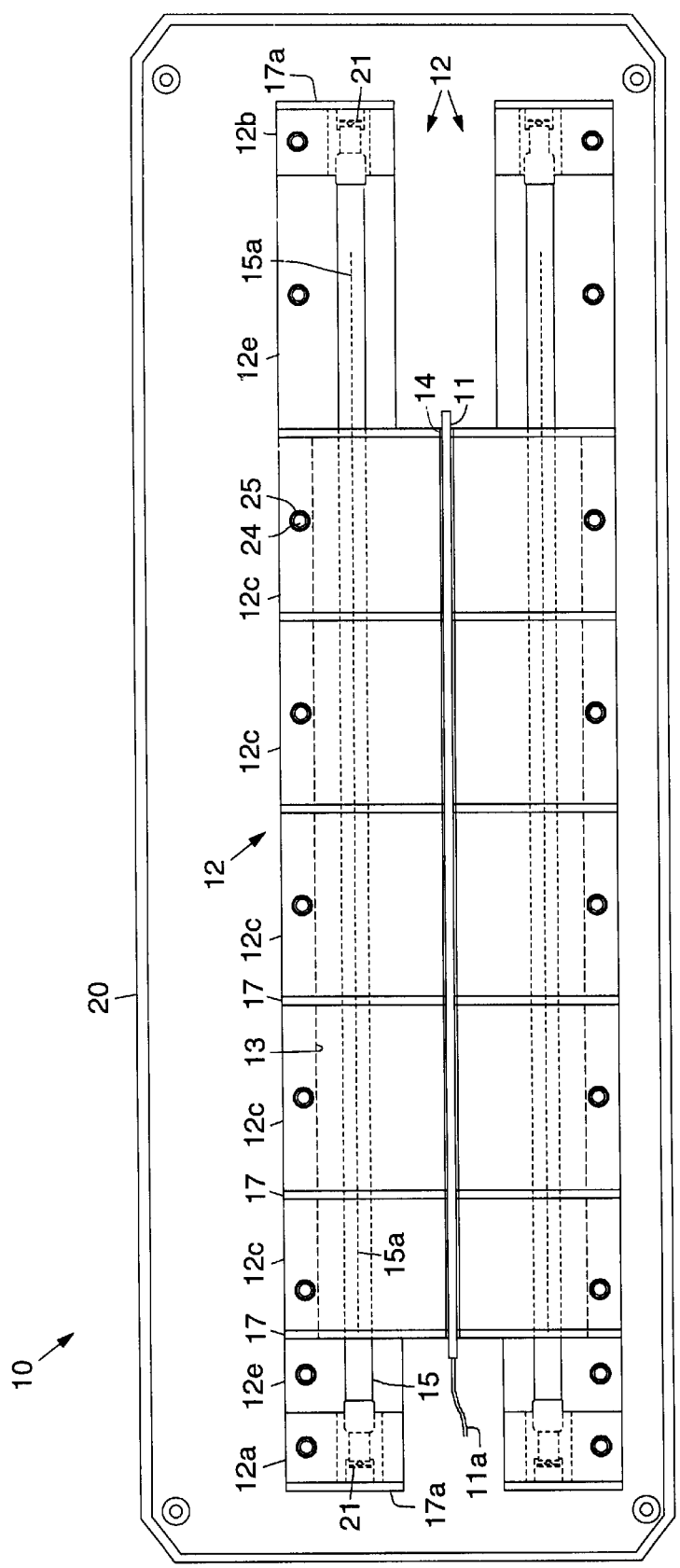
FIG. 2 illustrates a top view of another exemplary embodiment of an optical heat-generating apparatus in accordance with the principles of the present invention.

FIG. 2 illustrates a top view of another exemplary embodiment of an optical heat-generating apparatus 10 in accordance with the principles of the present invention. The second embodiment of the apparatus 10 is a relatively long device that is used to shrink a relatively long length of heat shrink tubing 11.

The second embodiment of the apparatus 10 comprises a housing 12 having first and second end sections 12a, 12b that sandwich a plurality of reflective central sections 12c. Reflective central sections 12c may be of differing width. The reflective central sections 12c may be formed in the manner described with reference to FIGS. 1a–1c. A plurality of spacer sections 12e, which also may be of differing widths, are disposed between the respective end sections 12a, 12b and the outermost reflective central sections 12c to locate the respective end sections 12a, 12b at the outer ends of the optical heat-generating elements 15. The respective reflective central sections 12c have reflective end plates 17 disposed therebetween and at outer ends of the outermost reflective central sections 12c.

The plurality of reflective central sections 12c each have reflective cavities 13a, as shown in FIG. 1a. A slot 14 is formed in each reflective central section 17 into which the wires 11a and tubing 11 may be inserted. The end of each slot 14 supports and positions the wires 11a and tubing 11 at the first focal line. The first and second end sections 12a, 12b and plurality of central sections 12c are secured to a base plate 20. These sections 12a, 12b, 12c may be secured using machine screws 24 inserted into holes 25 and captured by threaded holes in the base plate 20.

Figure 3A:
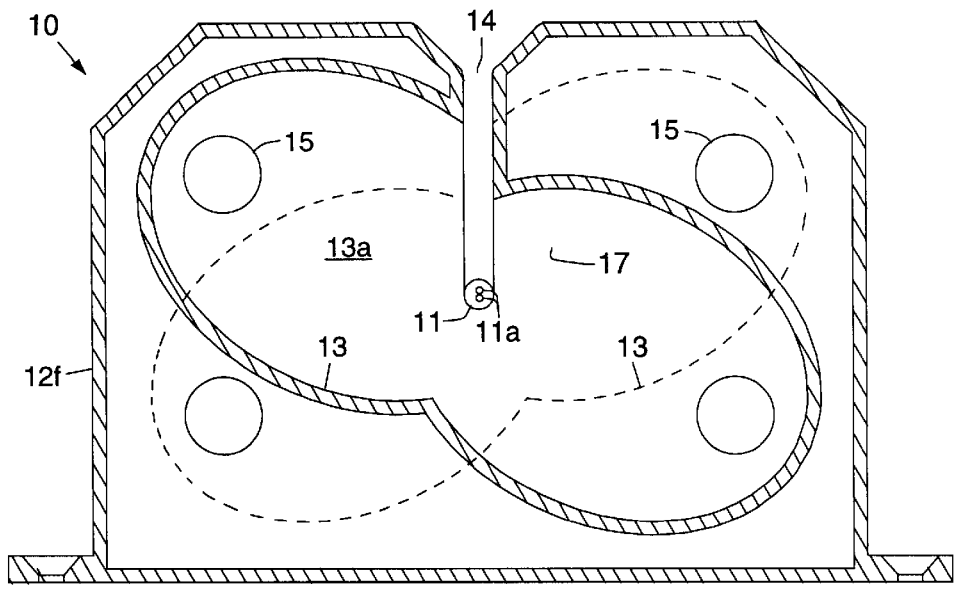
FIGS. 3a–3c show cross-sectional views of exemplary embodiments of optical beat-generating apparatus in accordance with the principles of the present invention that uses staggered dual reflectors.
Figure 3B:
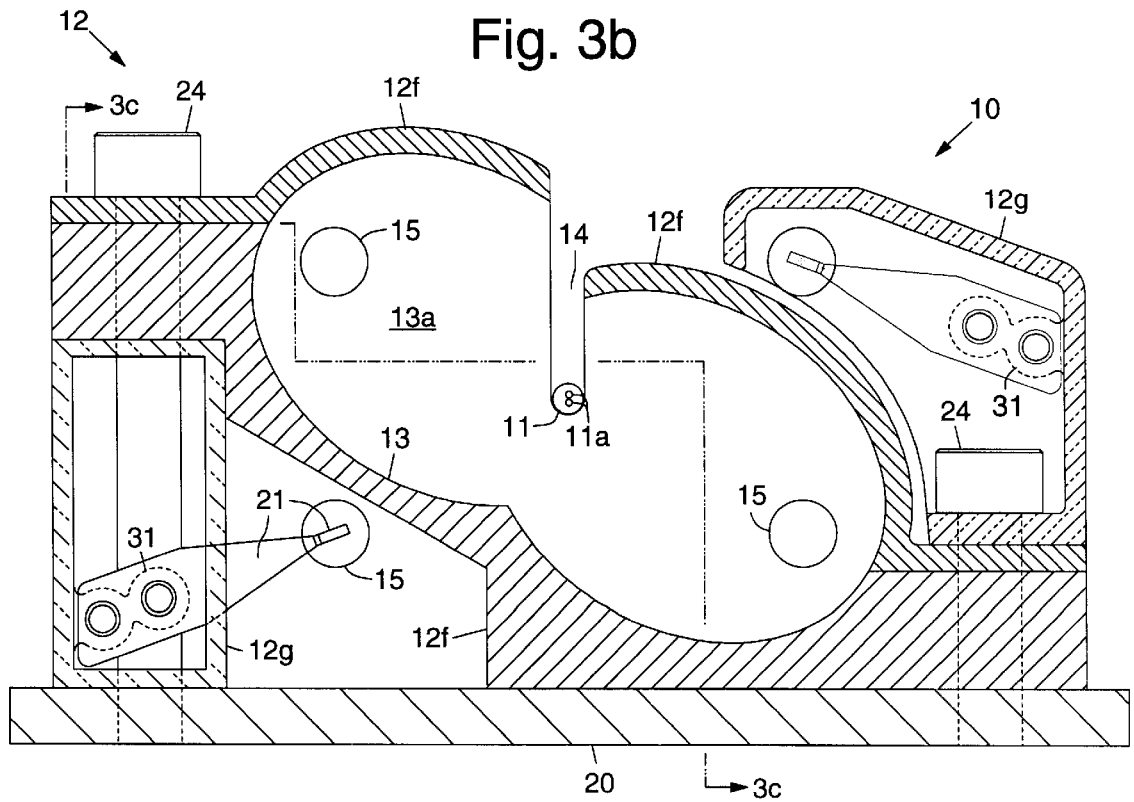
Figure 3C:
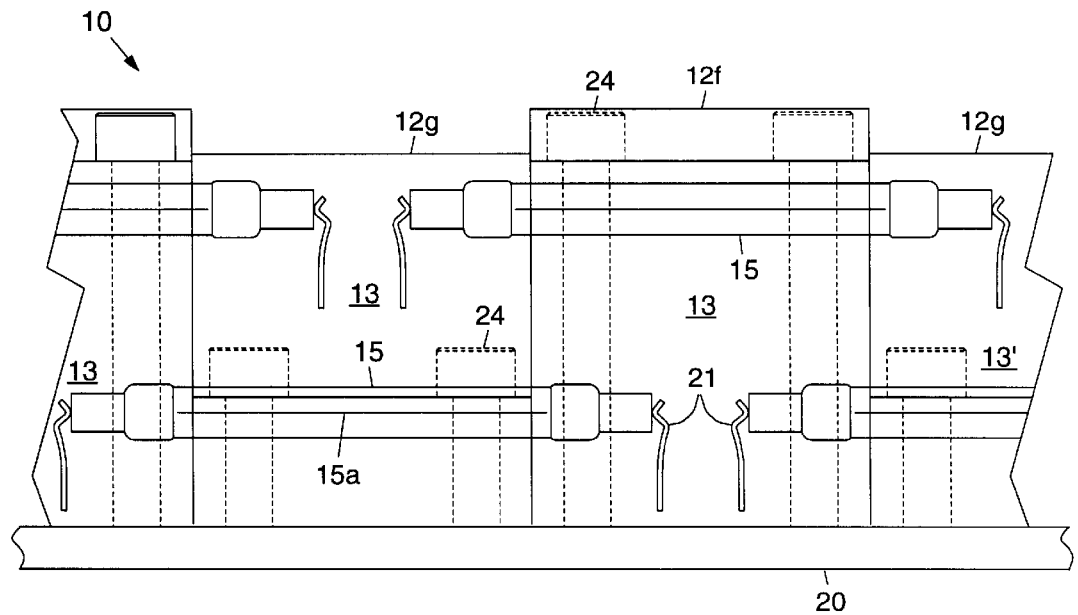

FIGS. 3a–3c show cross-sectional views of additional exemplary embodiments of optical heat-generating apparatus 10 that use staggered dual reflectors 13 to form an elongated heating device comparable to that shown in FIG. 2. The staggered dual reflectors 13 are angularly rotated(i relative to each other using the heat shrink tubing 11 as a pivotal axis. These embodiments of the optical apparatus 10 may use 2¾ inch long quartz-halogen lamps as the optical heat-generating elements 15.

The optical apparatus 10 shown in FIG. 3a comprises a series of extruded reflective sections 12f. Reflective end plates 17 are disposed adjacent to the outermost extruded sections 12f that have slots 14 therein which align the tubing 11 and wires 11a. Insulating sections 12g (FIG. 3c) comprising high temperature insulating material confine ends of the lamps 15 and the contacts 21. Each reflective section 12f has cavities 13a that are rotatably offset with respect to horizontal. Adjacent reflective sections 12f have cavities 13a that are flipped relative to each other, illustrated in FIG. 3a by the dashed lines. The electrical connections for the lamps 15 extend into the air space behind the reflective surface 13 of the adjacent cavities 13a. Thus, filaments 15a of adjacent lamps 15 create a continuous energy radiating element along the entire working length of the apparatus 10.

The embodiment shown in FIGS. 3b and 3c comprises a plurality of reflective sections 12f (three are shown) that are secured to a base plate 20, such as by machine screws 24 to form the reflective cavities 13a. The reflective sections 12f may preferably be made of aluminum. Inner surfaces of the plurality of reflective sections 12f are appropriately contoured as described above and polished to form the reflective cavities 13a. A plurality of insulating sections 12g are secured to the base plate 20 such as by machine screws L4 that house the contacts 21 that connect to the respective lamps 15. The contacts are secured to bosses 31 that are part of the insulating sections 12g by machine screws, for example.

Figure 4C:
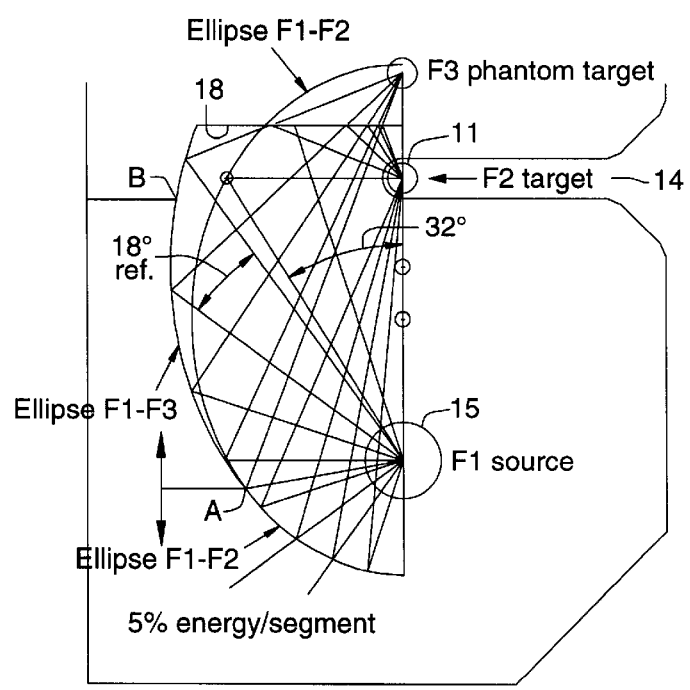
FIG. 4c shows a ray trace diagram for the apparatus shown in FIGS. 4a and 4b.
Figure 4A:
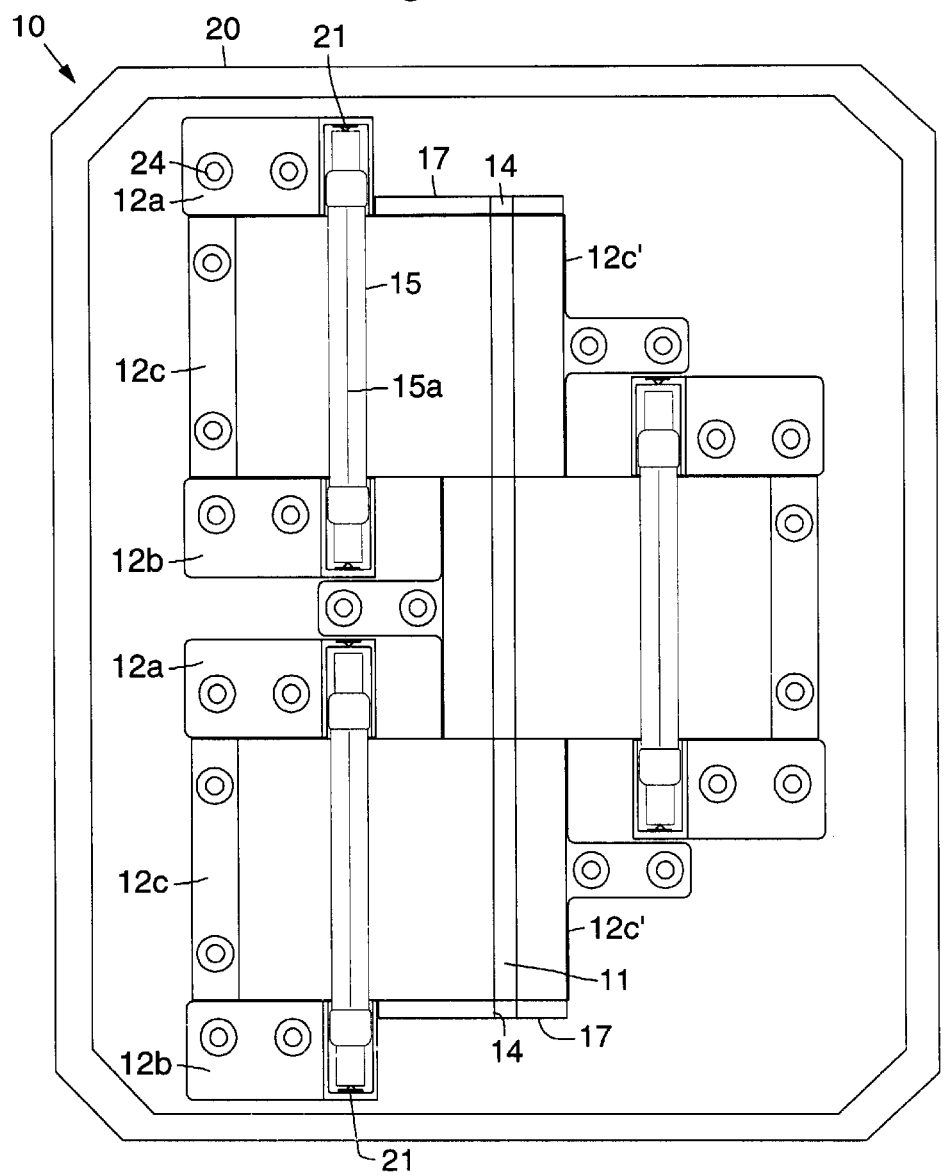
FIGS. 4a and 4b illustrate top and cross-sectional side views of another exemplary embodiment of optical heat-generating apparatus in accordance with the principles of the present invention for use in shrinking relatively long lengths of heat shrinkable tubing.
Figure 4B:
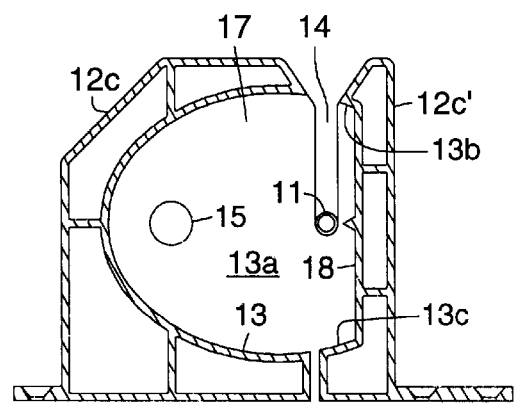

FIGS. 4a and 4b illustrate top and cross-sectional side views of another exemplary embodiment of optical heat-generating apparatus 10 in accordance with the principles of the present invention for use in shrinking relatively long lengths of heat shrinkable tubing 11. This embodiment of the apparatus 10 is a compact version of the apparatus 10 shown in FIGS. 2 and 3. FIG. 4c shows a ray trace diagram for the optical apparatus 10 shown in FIGS. 4a and 4b.

The optical apparatus 10 shown in FIGS. 4a and 4b is made using first and second extruded sections 12c, 12c' that form each of the cavity 13. The first extruded section 12c has multiple interior elliptical reflective surfaces 13 while the second extended section 12c' has a generally flat reflective surface 18, along with relatively small upper and lower surfaces that are elliptically shaped. End sections 12a, 12b are disposed at either end of the first extruded sections 12c. The end sections 12a, 12b comprise electrical contacts 21 that contact opposite ends of the optical heat-generating elements 15. Two reflective outer end plates 17 are coupled to the outermost ends of extruded sections 12c', 12c'. The reflective outer end plates 17 have slots 14 formed therein that accept and help to align the tubing 11 and wires 11a surrounded thereby. The extruded sections 12c, 12c' are attached to a base plate 20 by means of machine screws 24, for example.

The interior elliptical reflective surface 13 is formed as three connected elliptical surfaces. The first elliptical extends from a centerline to A as shown on FIG. 4c. This surface focuses energy from the lamp 15 onto a surface of the shrinkable tubing 11 that generally faces the lamp 15. A pair of second elliptical surfaces, one on each side of the centerline, extend from A to B, which focus energy from the lamp 15 to a phantom focal line F3 located beyond the flat reflective surface 18. The flat reflective surface 18 and two relatively small elliptically shaped sections 13b, 13c of the second extruded member 12c' focus energy from the lamp 15 onto the surface of the shrinkable tubing 11 that faces away from the lamp 15.

The optical apparatus 10 shown in FIGS. 4a and 4b illustrates how circumferential heat delivery can be achieved by employing two different elliptical reflectors 13 sharing the source focal line (the filament 15a of the lamp 15). One reflector 13 redirects about half of the light to the phantom focal point, thus missing the shrinkable tubing 11. The flat reflective surface 18 reflects this light into the shrinkable tubing 11 from behind, evening out power delivery.

FIGS. 5a and 5b illustrate side cross-sectional and top partially exposed views of another exemplary embodiment of optical heat-generating apparatus 10 in accordance with the principles of the present invention. This embodiment of the apparatus 10 uses a string of small lamps 15 in dual elliptical reflectors 13, with each lamp 15 is located in a separate socket 15b. The sockets 15b are preferably made from high temperature insulating material such as phenolic, for example. One or more reflective sections 12c containing at least one lamp 5 may be secured to a base plate 20 (such as is shown in FIG. 2) using machine screws 24 (not shown) threaded into respective threaded holes 24a. This embodiment of the optical apparatus 10 provides essentially any heat zone length, from a few thousands of an inch to many feet.

It has been found that certain types of heat shrink tubing 11 outgas when heated. Consequently, vent holes 27 may be provided to help remove outgassed material generated during operation. It is to be understood that such vent holes 27 may be provided in any of the previously disclosed embodiments of the apparatus 10. A fan 35 (shown in FIGS. 8a and 8b) may also be provided to force air through or draw air from the cavities 13a to remove the outgassed material.

Figure 6A:
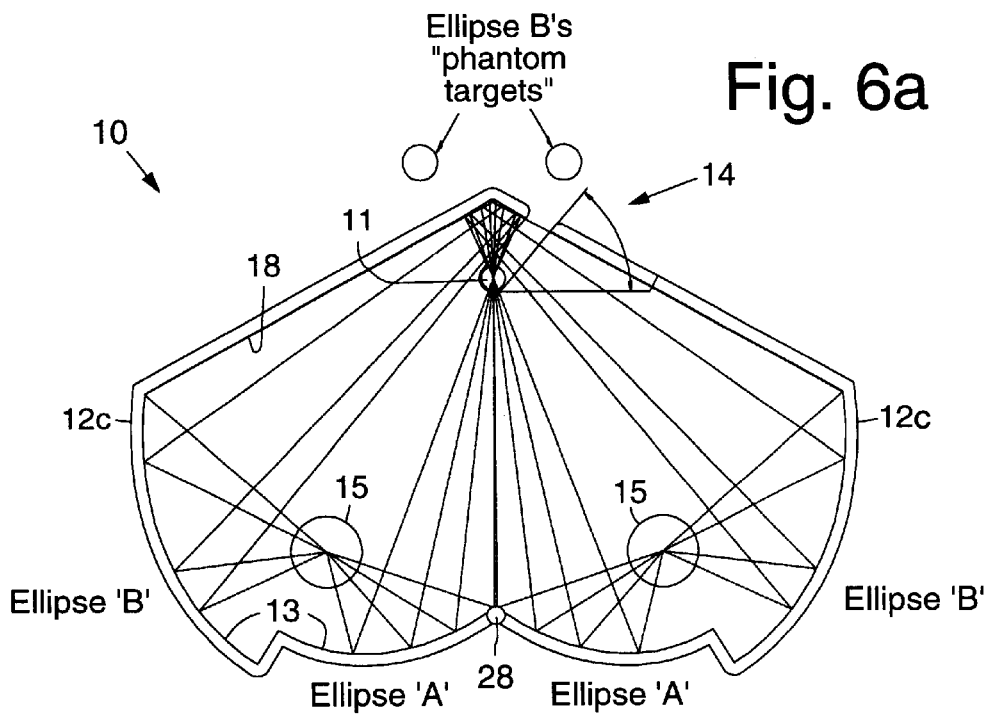
FIGS. 6a and 6b respectively illustrate side cross-sectional views of other exemplary embodiments of optical heat-generating apparatus in accordance with the principles of the present invention.
Figure 6B:
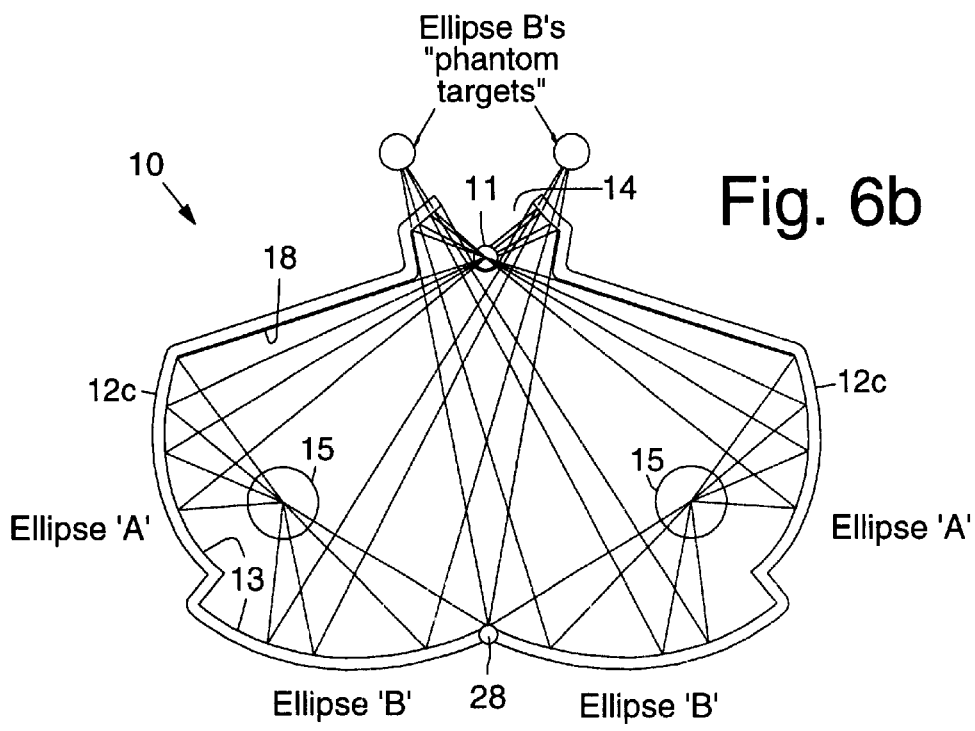

Referring now to FIGS. 6a and 6b, they respectively illustrate side cross-sectional views of additional embodiments of optical heat-generating apparatus 10 in accordance with the principles of the present invention. These embodiments of the optical apparatus 10 are designed to shrink tubing 11 in situations where limited space is available. For example, these embodiments of the optical apparatus 10 may be used to selectively shrink tubing 11 over a separate wire of a wire bundle that is spliced, or near a connector.

The optical apparatus 10 has two reflective sections 12c that are preferably fixed, but that may be opened by means of an optional hinge 28, such as in the manner of the jaws of pliers, for example, to allow insertion of the wire and heat shrink tubing 11. The reflective sections 12c comprise a plurality of elliptical reflective surfaces 13 along with a plurality of flat reflective surfaces 18. Two lamps 15 are disposed along first focal lines of the respective elliptical reflective surfaces 13. The optical apparatus 10 has end plates 17 with reflective internal surfaces and slots 14 disposed therein in the manner of the other disclosed embodiments. Electrical contacts 21 disposed in end sections 12a, 12b (not shown in FIGS. 6a or 6b) are provided at opposite ends of the reflective sections 12c to hold the two lamps 15. The end sections 12a, 12b may be formed in the manner disclosed with reference to FIG. 4a, for example.

The wire or wires and heat shrink tubing 11 are inserted in the slot 14 or opening shown at the top of the respective devices along the second focal lines of the respective elliptical reflective surfaces 13. Energy from the lamps 15 is reflected from internal reflective surfaces 13, 18 and is focused onto the heat shrink tubing 11. Energy from each of the lamps 15 is reflected from ellipse "B" towards phantom focal lines outside the apparatus 10, and is reflected from portions of the flat reflective surfaces 18 onto the heat shrink tubing 11 facing away from the lamps 15.

Figure 7A:
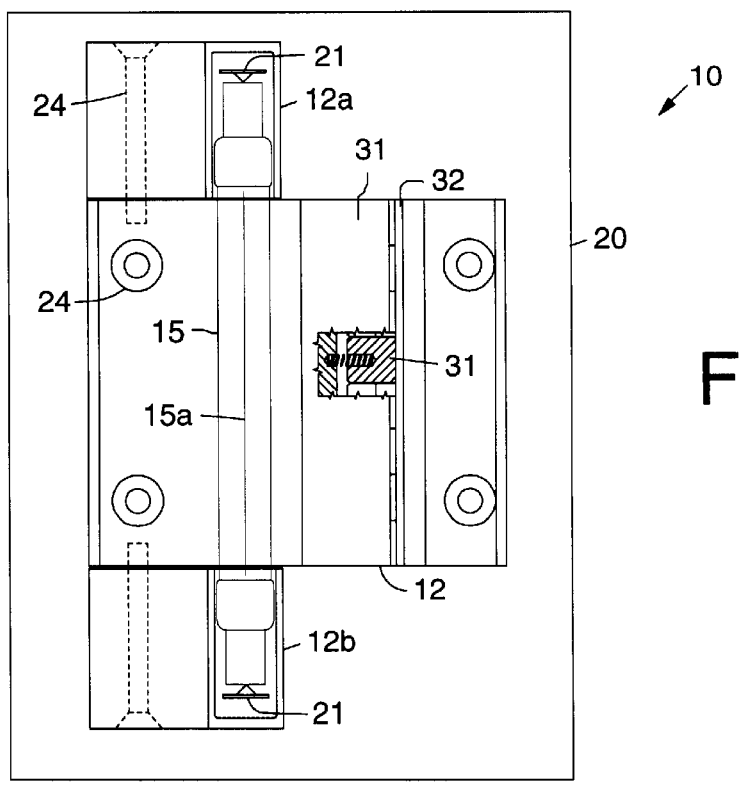
FIGS. 7a and 7b illustrate top and cross-sectional side views of another exemplary embodiment of optical heat-generating apparatus in accordance with the principles of the present invention for use in fusing wires together.
Figure 7B:
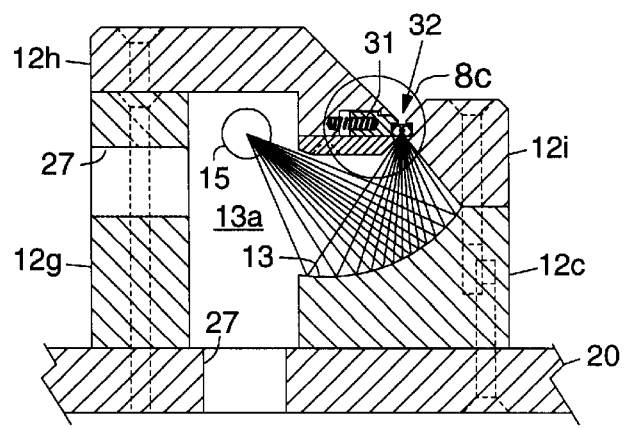
Figure 7C:
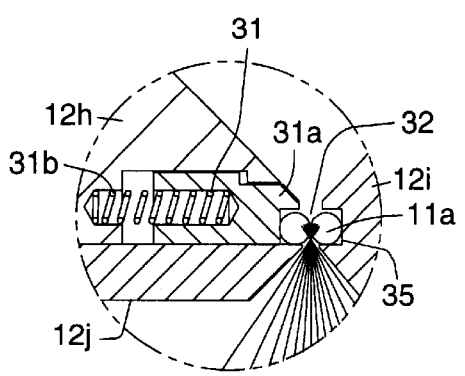
FIG. 7c illustrates an enlarged view of the encircled portion of the apparatus shown in FIG. 7b.

Referring now to FIGS. 7a and 7b, they illustrate top and cross-sectional side views of another exemplary embodiment of optical heat-generating apparatus 10 in accordance with the principles of the present invention. FIG. 7c illustrates an enlarged view of the encircled portion of the apparatus 10 shown in FIG. 7b. This embodiment of the optical apparatus 10 may be used to weld two adjacent wires 11a together by melting or fusing their insulation together.

The optical apparatus 10 comprises first and second end sections 12a, 12b made of high temperature insulating material, for example, that are disposed at either ends of a central section 12. The first and second end sections 12a, 12b and the central section 12 are secured together and are secured to a base plate 20. The central section 12 comprises a spacer 12g or back plate 12g, to which a left wire support plate 12h is secured by means of machine screws 24.

The spacer 12g or back plate 12g is secured to the base plate 20. The spacer 12g or back plate 12g and the base plate 20 have openings 27 therein that are used to remove outgassed material from the cavity 13a. The central section 12 also comprises a reflective section 12c which is secured to the base plate 20. The reflective section 12c has an elliptical reflective surface 13 formed on an inner surface. A right wire support plate 12i is secured by means of machine screws 24 to the reflective section 12c.

The left wire support plate 12h comprises a plurality of spring-loaded sidable members 31 that are held in place by means of a lower retainer 12j. The lower retainer 12j is secured to the left wire support plate 12h using machine screws (not shown). The spring-loaded slidable members 31 may comprise a slidable block 31a having a hole formed in its rear end into which one end of a spring 31b is disposed. The other end of the spring 31b is disposed in a hole formed in the left wire support plate 12h. The slidable block 31 a has a step formed therein that is abuts a complementary step in the end of left wire support plate 12h to limit the travel of the slidable block 31a. A slot 35 is formed at the end of the spring-loaded slidable members 31 and in the adjacent portion of the right wire support plate 12i which form a channel 32.

The spring-loaded slidable members 31 may be sequentially slid back to allow at least two wires 11a to be inserted into the channel 32 formed between the left and right wire support plates 12h, 12i that holds the at least two wires together. This is shown most clearly in the enlarged view of FIG. 7c.

The optical apparatus 10 shown in FIGS. 7a and 7b provides for a linear radiant energy focusing device. Energy radiated by the lamp 15 is reflected from the elliptical reflective surface 13 onto the juncture between two adjacent wires 11a. It may be used to fuse or weld the insulation of the at least two wires together. By using a singlesource (lamp 15) fixture shown in FIGS. 7a and 7b and focusing heat energy onto the at least two wires 11a while squeezing them gently together, fusion of the wire insulation is achieved. This version of the optical apparatus 10 may be also used to fuse medical PVC tubing, solder coated metal tubing, electrical component leads, and the like.

Figure 8A:
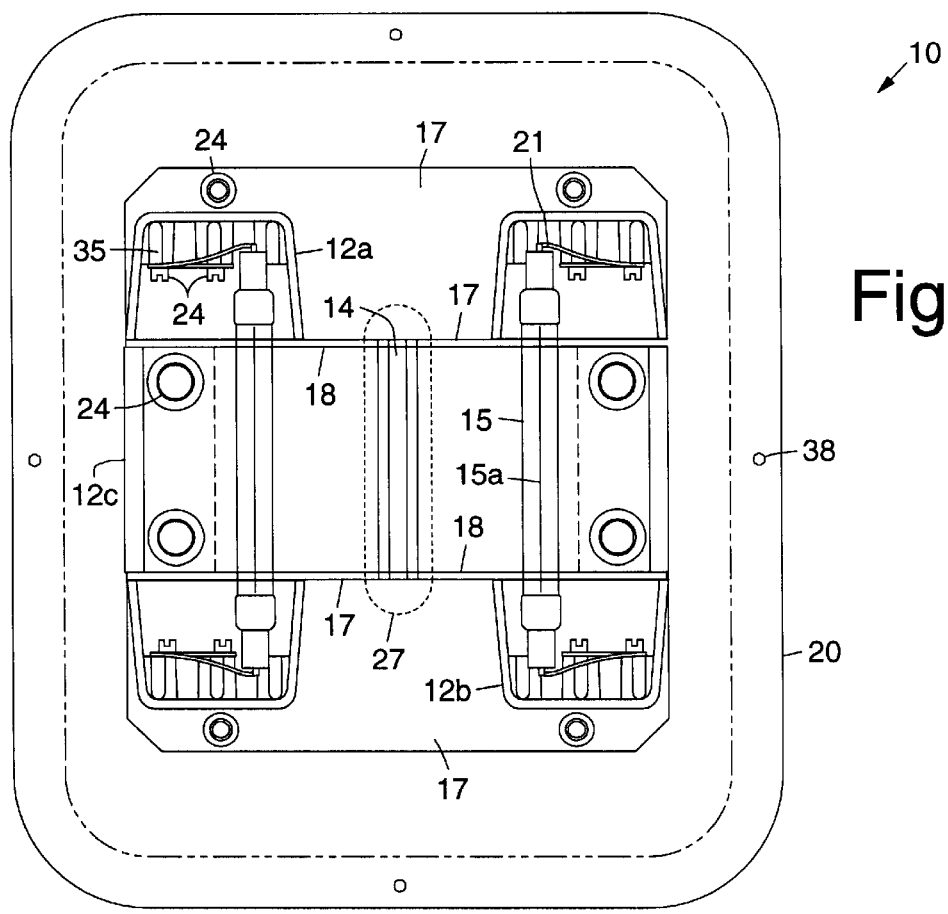
FIGS. 8a and 8b illustrate cross-sectional top and side views, respectively, of a production version of optical heat-generating apparatus in accordance with the principles of the present invention.
Figure 8B:
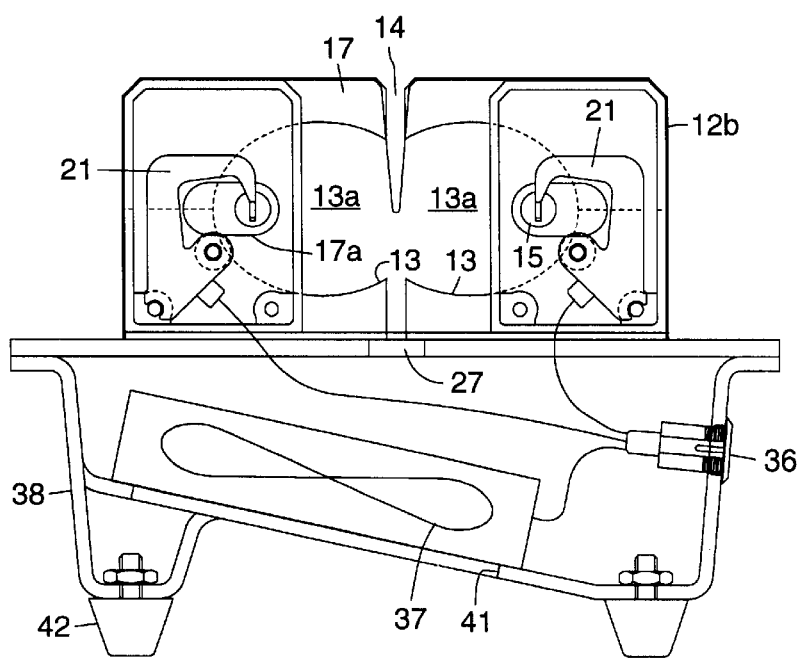

FIGS. 8a and 8b illustrate cross-sectional top and side views, respectively, of a production version of optical apparatus 10 in accordance with the principles of the present invention. The production version of the optical apparatus 10 is generally configured in the manner described with reference to FIGS. 1a and 1b, with certain additions and modifications.

The optical apparatus 10 comprises two L-shaped end brackets 17 that abut a central reflective section 12c. The end brackets 17 and the central section 12c are secured to a base plate 20 by means of machine screws 24, for example. The central reflective section 12c comprises two elliptically shaped reflective surfaces 13 that form a plurality of reflective cavities 13a. The reflective central section 12c may be made of aluminum, for example, which is polished to make the internal surfaces 13 reflective.

The end brackets 17 each have a plurality of elongated holes 17a (FIG. 8b) formed therein through which a plurality of lamps 15 are disposed. The lamps 15 have linear filaments 15a. The elongated holes 17a permit insertion and removal of the lamps 15. The L-shaped end brackets 17 each have a slot 14 formed therein that allows insertion of the wires and surrounding shrink tubing 11, locating them in the first focal line of elliptical surface 13.

First and second pairs of end sections 12a, 12b are secured to the end brackets 17 and the base plate 20 that abut vertical walls of the end brackets 17. The end sections 12a, 12b are made from high temperature insulating material. A plurality of bosses 35 are formed in the interior of the end sections 12a, 12b to which spring-loaded or flexible spring-like electrical contacts 21 are secured, such as by means of machine screws 24, for example. The electrical contacts 21 engage opposite ends of the elongated lamps 15 and hold them in place collinear with the second focal line of surface 13.

The contacts 21 may be made of stamped metal having the shape somewhat like a bird's claw. The contacts 21 are secured to the bosses 25 which allow tips of the contacts 21 to flex to cause them to be spring loaded against ends of the lamps 15 after assembly. The electrical contacts 21 are connected to a power source (not shown) by means of an on-off switch 36 (FIG. 8b).

In addition, as is shown in FIG. 8b, a fan 37 is coupled to the on-off switch 36 are located in a lower housing 38 secured below the base plate 20. The lower housing 38 may be secured to the base plate 20 using rivets 38, for example. The on-off switch 36 may be coupled to a foot switch (not shown) for use in turning on and off the optical apparatus 10 while holding the tubing 11. The fan 37 is used to draw air from the cavity 13a through a vent hole 27 in the base late 20 and output the air through an opening 41 in the lower housing 38. As was stated above, the fan 37 and vent hole 27 are used to remove outgassed tubing material from the interior of the cavity 13 and help cool the apparatus. This reduces the amount of cleaning required to keep the reflective surface 13 clean of residue. The lower housing 37 may be formed to have a plurality of adjustable rubber feet 42 that allow the optical apparatus 10 to sit on a working surface.

Therefore, and by way of summary, in the optical apparatus 10 disclosed above, an essentially linear filament 15a of the lamp 15 is positioned in one of the focal lines of the reflective surface 13 formed by linear displacement of an elliptical curve in a sectional plane perpendicular to the direction of displacement. Alternatively, more than one elliptical reflective surface 13 sharing a focal line where the filament 15a is positioned may be used, and the energy emitted by the filament 15a is directed toward the respective second focal lines of the elliptical reflective surface 13. The emitted radiant energy may be apportioned between the elliptical reflective surfaces 13, and therefore between their respective second focal lines.

Alternatively, a secondary reflective surface 18 may be used to redirect energy collected by a second elliptical reflector 13 toward the focal line of a first elliptical reflector 13, with that energy arriving there from a different direction from the energy arriving directly from a first elliptical reflector 13. More than one filament 15a may be used, each in a focal line of one or more elliptical reflective surfaces 13, arranged with respect to a target to provide more, and/or better distributed radiant energy. Reflective flat surfaces 18 at the ends of elliptical cavities 13a may be used to provide more uniform solid angle of energy reception for the target, and therefore more uniform energy delivery for the length of the cavities 13a.

Means for limiting heat delivery to specific areas of the heat shrink tubing 11 or components, by masking, preferably with reflective surfaces, may be built into the optical apparatus 10, or pre-applied onto a component before insertion into the optical apparatus 10. Heat absorption is color dependent, and in many applications, part color (material color or applied paint) may be used to help or hinder heating of specific parts.

Heat shrink tubing 11 is widely used in many different applications. In terms of location and accessibility at the shrink operation, most fall into one of two categories: "jacket" and "termination". Prototype devices built to prove out the principles of the present invention satisfy the "jacket" need, where the tubing 11 is over a length of wire or similar long, slender object, and one or both ends emerge from the tubing 11 and are available to position the tubing 11 for the shrinking operation.

The "termination" application has limited accessibility, and typically one or more wires or the like are next to a bulky object such as a connector or bulkhead. The optical apparatus depicted in FIGS. 6a and 6b is preferred in this application, because it allows all the bulky components (lamp and main reflectors) to be off to one side, with only the rear mirror behind the tube being shrunk. The various embodiments of the optical apparatus 10 are designed to shrink lengths of heat shrink tubing having lengths range between 3 to 20 inches in less than one second. However, it is to be understood that there are no specific length limitations to the apparatus 10 or the lengths of tubing 11 that may be shrunk.

Referring to FIG. 9, it is a flow chart that illustrates an exemplary method 30 in accordance with the principles of the present invention for shrinking heat shrinkable tubing. The method 30 comprises the following steps. One or more reflective cavities are provided 31 that each comprise a linear substantially elliptical reflective surface having first and second focal lines. One or more optical heat-generating elements are disposed 32 along the second focal line of each respective linear elliptical reflective surface. A heatable component is disposed 33 along the first focal line. Energy emitted by the optical heat-generating elements is focused 34 by the one or more linear elliptical reflective surfaces onto the heatable component disposed along the first focal line.

Referring to FIG. 10, it is a flow chart that illustrates another exemplary method 30a in accordance with the principles of the present invention for fusing insulated wires together. The method 30a comprises the following steps. One or more reflective cavities are provided 31 that each comprise a linear substantially elliptical reflective surface having first and second focal lines. One or more optical heat-generating elements are disposed 32 along the second focal line of each respective linear elliptical reflective surface. Insulated wires that are to be fused together are disposed 35 along the first focal line. The energy emitted by the optical heat-generating elements is focused 34 by the one or more linear elliptical reflective surfaces onto insulation of the insulated wires to fuse them together.

Figure 11:
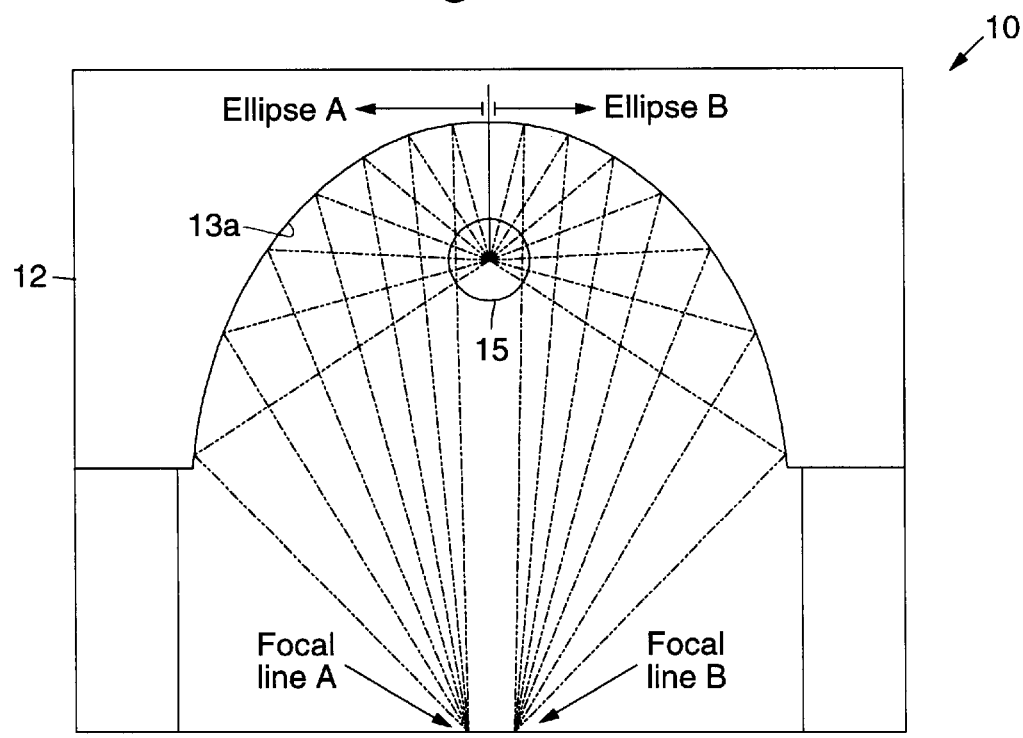
FIGS. 11 and 12 illustrate side and perspective views, respectively, of an exemplary embodiment of optical heat-generating apparatus in accordance with the principles of the present invention for soldering or unsoldering dual inline packaged semiconductor chips.
Figure 12:
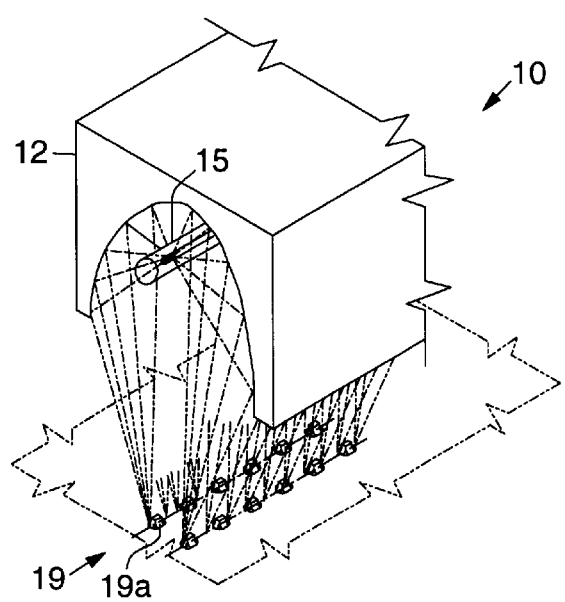

Referring to FIGS. 11 and 12, they illustrate side and perspective views, respectively, of an exemplary embodiment of optical heat-generating apparatus 10 in accordance with the principles of the present invention for soldering or unsoldering dual inline packaged semiconductor chips. FIGS. 11 and 12 illustrate a preferred geometry and raytracing for the optical heat-generating apparatus 10 employable to obtain to two first parallel focal lines from a single substantially linear radiant energy source 15. One or more reflective cavities 13a are provided that comprise elongated linear elliptical reflective surfaces A, B that share a common second focal line along which the linear radiant energy source 15 is located. Radiant energy focused at the first focal lines of the surfaces A, B may be used, for example, to solder and unsolder electronic components 19 (generally designated by an arrow in FIG. 12) having multiple leads 19a arranged in two parallel lines, such as a dual inline packaged semiconductor chip 19, for example, whose leads 19a are illustrated in FIG. 12. As is shown in FIG. 12, the radiant energy is focused onto the leads 19a of the chip 19 in order to solder of unsolder the chip 19.

Figure 13:
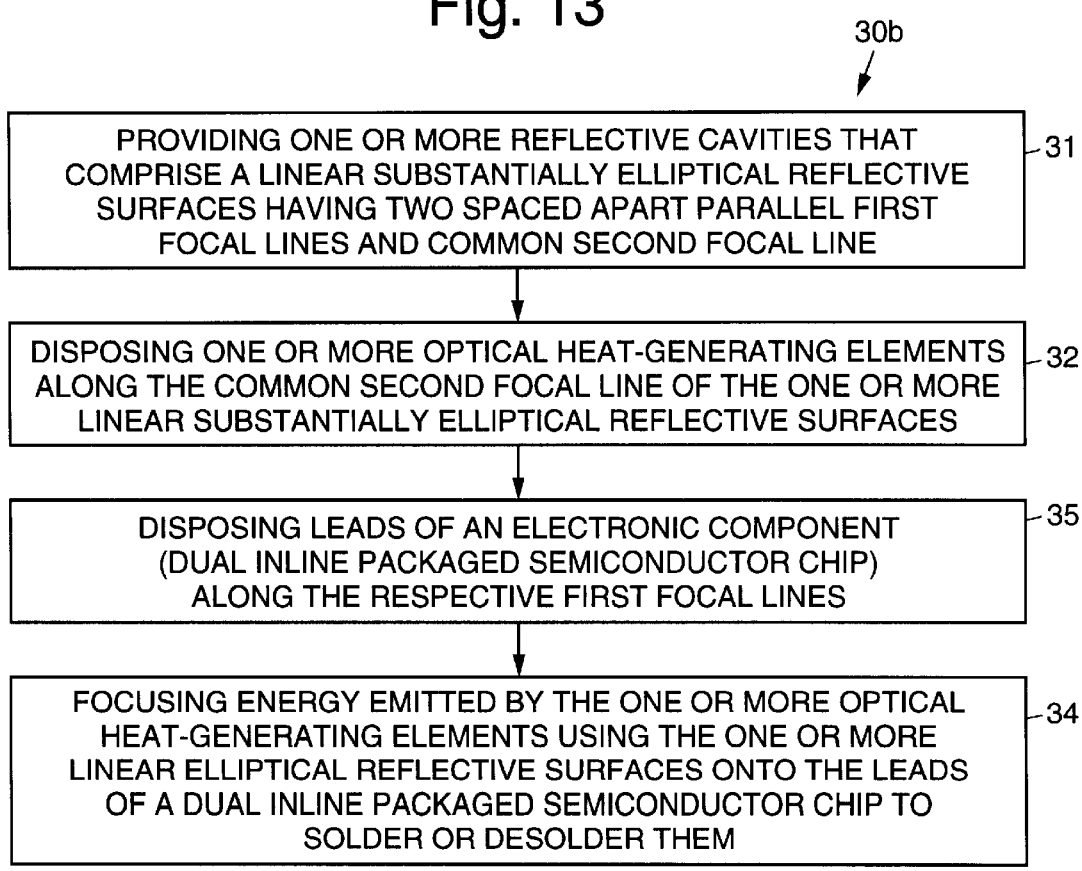
FIG. 13 is a flow chart that illustrates an exemplary method in accordance with the principles of the present invention for soldering or unsoldering dual inline packaged semiconductor chips.

FIG. 13 is a flow chart illustrating an exemplary method 30b in accordance with the principles of the present invention for soldering or unsoldering dual inline packaged semiconductor chips. The exemplary method 30b comprises the following steps. One or more reflective cavities are provided 31 that each comprise a linear substantially elliptical reflective surface having two parallel spaced apart first focal lines and a common second focal line. One or more optical heat-generating elements 15 are disposed 32 along the common second focal line of the linear elliptical reflective surfaces. A dual inline packaged semiconductor chip that is to be soldered or unsoldered has its leads respectively disposed 37 along the respective first focal lines of the linear elliptical reflective surfaces. The energy emitted by the optical heat-generating element 15 is focused 34 by the one or more linear elliptical reflective surfaces onto the leads to solder or unsolder them.

Thus, optical heat-generating apparatus and methods for shrinking heat shrinkable tubing, fusing insulated wires, and soldering and unsoldering IC chips have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. An optical heat-generating apparatus for heating a heatable component, comprising:

one or more reflective cavities, each comprising a substantially elliptical reflective surface having first and second focal lines, and into which the heatable component may be inserted and disposed along the first focal line;

an optical heat-generating element disposed along the second focal line of each reflective cavity, a portion of the emitted energy of which is focused by the one or more elliptical reflective surfaces onto the heatable component disposed along the first focal line; and end plates disposed at the respective outermost ends of the cavities, the end plates having slots formed therein into which the heatable component is inserted when it is to be heated and which locate the heatable component substantially along the first focal line.

2. The apparatus recited in claim 1 wherein the one or more optical heat-generating elements comprise a quartz-halogen lamp.

3. The apparatus recited in claim 1 wherein the one or more optical heat-generating elements further comprise electrical contacts coupled to a power source for supplying power to the optical heat-generating elements.

4. The apparatus recited in claim 1 wherein the reflective cavities comprise a plurality of staggered dual reflectors.

5. The apparatus recited in claim 1 wherein the reflective cavities comprise extruded members.

6. The apparatus recited in claim 1 wherein the one or more optical heat-generating elements comprise filaments that are disposed to create a continuous energy radiating element along the length of the apparatus.

7. The apparatus recited in claim 1 wherein the one or more reflective cavities each comprise an interior substantially elliptical reflective surface having a plurality of differing substantially elliptical surface contours with a generally flat reflective surface, wherein one generally elliptical surface contour focuses energy from the optical heat-generating element onto a surface of the heatable component generally facing it and wherein another generally elliptical surface contour focuses energy from the optical heat-generating element to a phantom focal line located beyond the flat reflective surface while the flat reflective surface reflects the energy from the optical heat-generating element onto a surface facing away from the heatable component.

8. The apparatus recited in claim 1 wherein the one or more optical heat-generating elements each comprise a string of lamps disposed along the second focal line of each respective substantially elliptical reflective surface.

9. The apparatus recited in claim 1 wherein the one or more reflective cavities comprise a plurality of substantially elliptically shaped reflective surfaces and one or more flat reflective surfaces that reflect and focus energy from the one or more optical heat-generating elements onto the heatable component.

10. The apparatus recited in claim 1 further comprising one or more spring-loaded members that allow at least two insulated wires to be inserted into a channel which holds the wires together while energy from the one or more optical heat-generating elements is focused to fuse the insulation of the wires together.

11. The apparatus recited in claim 1 wherein the one or more reflective cavities each comprise first and second end sections and a central section disposed therebetween which are secured to a base plate, and wherein the end sections each have a slot formed therein allowing insertion of the heatable component into the slots.

12. The apparatus recited in claim 1 further comprising fan apparatus for ventilating the one or more cavities while heating the heatable component.

13. A method for shrinking heat shrinkable tubing comprising the steps of:

providing one or more reflective cavities that each comprise a substantially elliptical reflective surface having first and second focal lines and end plates disposed at the respective outermost ends of the one or more cavities, the end plates having slots formed therein into which a heatable component and the heat shrinkable tubing are inserted when it is to be heated and which locate the heatable component and the heat shrinkable tubing substantially along the first focal line;

disposing one or more optical heat-generating elements along the second focal line of each respective substantially elliptical reflective surface;

disposing a heatable component having heat shrinkable tubing disposed therearound in the slots in the end plates so that it is disposed substantially along the first focal line; and focusing energy emitted by the one or more optical heat-generating elements off of the one or more elliptical reflective surfaces onto the heatable component disposed along the first focal line.

14. The method recited in claim 13 wherein the step of disposing one or more optical heat-generating elements comprises the step of disposing one or more quartz-halogen lamps along the first focal line of each respective elliptical reflective surface.

15. The method recited in claim 13 wherein the step of providing one or more reflective cavities comprises the step of providing one or more staggered dual reflective cavities.

16. The method recited in claim 15 wherein the step of providing one or more reflective cavities comprises the steps of:

providing an elongated internally reflective elliptical surface having a plurality of differing substantially elliptical surface contours;

focusing energy using one of the substantially elliptical surface contours from the one or more optical heat-generating elements onto a surface of the heatable component generally facing it;

focusing energy using another substantially elliptical surface contour from the one or more optical heat-generating elements to a phantom focal line located beyond the flat reflective surface; and reflecting the energy focused to the phantom focal line using a flat reflective surface onto a surface facing away from the heatable component.

17. The method recited in claim 16 further comprising the step of:

providing a generally flat reflective surface at opposite ends of the elongated internally reflective substantially elliptical surface.

18. The method recited in claim 15 wherein the step of disposing one or more optical heat-generating elements comprises the step of disposing a string of lamps along the second focal line of each respective elliptical reflective surface.

19. The method recited in claim 13 wherein the step of providing one or more reflective cavities comprises providing one or more reflective cavities having one or more substantially elliptical reflective surfaces and one or more flat reflective surfaces which reflect and focus energy from the one or more optical heat-generating elements onto the heatable component.

20. The method recited in claim 13 wherein the step of disposing a heatable component along the second focal line comprises disposing insulated wires adjacent each other an along the first focal line, and wherein the step of focusing energy from the one or more optical heat-generating elements comprises focusing energy from the one or more optical heat-generating elements onto insulation of the adjacent wires to fuse them together.

21. A method for fusing insulated wires together comprising the steps of: providing one or more reflective cavities that each comprises a substantially elliptical reflective surface having first and second focal lines, and end plates disposed at the respective outermost ends of the cavities, the end plates having slots formed therein into which the insulated wires are inserted when they are to be fused together; disposing one or more optical heat-generating elements along the second focal line of each respective substantially elliptical reflective surface; disposing insulated wires that are to be fused together in the slots in the end plates so that they are disposed substantially along the first focal line; and causing the optical heat-generating elements to emit energy that focused by the one or more substantially elliptical reflective surfaces onto insulation of the insulated wires to fuse them together.

22. An optical heat-generating apparatus comprising:

one or more elongated substantially elliptically shaped internally reflective cavities each having first and second focal lines;

one or more optical heat-generating elements disposed along the second focal line of each cavity that emit energy which is focused by the one or more cavities along the first focal line; and end plates disposed at the respective outermost ends of the cavities, the end plates having slots formed therein into which a heatable component is inserted when it is to be heated and which locate the heatable component substantially along the first focal line.

23. The apparatus recited in claim 22 additionally comprising the means to place a heatable component along the first focal line.

24. An optical heat-generating apparatus comprising:

two or more elongated substantially elliptically shaped internally reflective cavities each having first and second focal lines wherein the first focal lines are substantially collinear;

one or more optical heat-generating elements disposed along the first focal line of each cavity that emit energy which is focused by the one or more cavities along the second focal lines; and end plates disposed at the respective outermost ends of the outermost cavities, the end plates having slots formed therein into which a heatable component is inserted when it is to be heated and which locate the heatable component substantially along the first focal line.

25. A method for shrinking heat shrinkable tubing comprising the steps of:

providing one or more substantially elliptically shaped internally reflective cavities that each have first and second focal lines and end plates disposed at the respective outermost ends of the one or more cavities, the end plates having slots formed therein into which the heatable component is inserted when it is to be heated and which locate the heatable component substantially along the first focal line;

disposing an optical heat-generating element along the first focal line of each respective cavity;

disposing a heatable component having heat shrinkable tubing disposed therearound in the slots in the end plates so that they are disposed substantially along the second focal line; and focusing energy emitted by the optical heat-generating elements off of the one or more elliptically shaped internally reflective cavities onto the heat shrinkable tubing to shrink it.

26. An optical heat-generating apparatus comprising:

one or more elongated substantially elliptically shaped internally reflective cavities each having two parallel spaced apart first focal lines and a common second focal line;

one or more optical heat-generating elements disposed along the common second focal line that emit energy which is focused by the one or more cavities along the respective first focal lines; and end plates disposed at the respective outermost ends of the outermost cavities, the end plates having slots formed therein into which a heatable component is inserted when it is to be heated and which locate the heatable component substantially along the first focal line.

* * * * *